United States Patent
Spaeth

[11] Patent Number: 6,014,478
[45] Date of Patent: Jan. 11, 2000

[54] OPTICAL SWITCH

[75] Inventor: Werner Spaeth, Holzkirchen, Germany

[73] Assignee: Siemens Aktiengesellschaft, Munich, Germany

[21] Appl. No.: 08/666,099

[22] Filed: Jun. 19, 1996

[30] Foreign Application Priority Data

Jun. 19, 1995 [DE] Germany ............. 195 22 166

[51] Int. Cl.[7] .................................. G02B 6/26
[52] U.S. Cl. .................................. 385/18; 385/23
[58] Field of Search ............... 385/16–23; 359/199, 359/223, 224, 225, 226

[56] References Cited

U.S. PATENT DOCUMENTS

| | | | |
|---|---|---|---|
| 4,514,860 | 4/1985 | Adolfsson et al. | 455/612 |
| 4,614,119 | 9/1986 | Zavracky et al. | 73/704 |
| 4,739,163 | 4/1988 | Gambs et al. | 250/227 |
| 4,784,448 | 11/1988 | Sepp et al. | 350/6.6 |
| 4,903,337 | 2/1990 | Newell et al. | 455/605 |
| 5,163,112 | 11/1992 | Lefevre et al. | 385/19 |
| 5,265,179 | 11/1993 | Ishiguro et al. | 385/33 |
| 5,268,741 | 12/1993 | Chou et al. | 356/351 |
| 5,387,803 | 2/1995 | Kurtz et al. | 257/3 |
| 5,408,550 | 4/1995 | Lefevre et al. | 385/18 |
| 5,450,231 | 9/1995 | Blättig et al. | 359/290 |

FOREIGN PATENT DOCUMENTS

| | | |
|---|---|---|
| 0 279 515 A1 | 8/1988 | European Pat. Off. . |
| 0 550 017 A2 | 7/1993 | European Pat. Off. . |
| 0 599 154 A1 | 6/1994 | European Pat. Off. . |
| 35 24 492 | 1/1987 | Germany . |
| 36 01 764 | 3/1989 | Germany . |
| 42 34 916 | 1/1995 | Germany . |

*Primary Examiner*—Hung N. Ngo
*Attorney, Agent, or Firm*—Herbert L. Lerner; Laurence A. Greenberg

[57] ABSTRACT

An optical switch includes an optical transmission path having an optical transmission medium, an input-side end and an output-side end. A radiation source is associated with the input-side end for emitting a primary optoelectronic signal being coupled into the transmission path. A reflection device is associated with the output-side end for receiving the primary optoelectronic signal and converting the primary optoelectronic signal into a secondary, modulated optoelectronic signal being reflected and coupled back into the transmission path. A receiver is associated with the input-side end of the transmission path for responding to the secondary, modulated optoelectronic signal to perform an electronic switching operation.

19 Claims, 1 Drawing Sheet

OPTICAL SWITCH

BACKGROUND OF THE INVENTION

1. Field of the Invention

The present invention relates to an optical switch having an optical transmission path with an optical transmission medium, a radiation source associated with an input-side end of the optical transmission path for emitting a primary optoelectronic signal being coupled into the transmission path, and a reflection device associated with an output-side end of the transmission path for receiving and reflecting the primary optoelectronic signal back into the transmission path.

A known optical switch of that kind uses two fiberoptical waveguides, specifically one fiber for an outgoing path and one fiber for a return path of the optoelectronic signal. In the switching operation, as a rule the location of a suitably constructed reflector is changed in such a way that either it couples the light signal from one fiber into the other fiber, or it interrupts an already existing coupling in of the light signal.

Very generally, it is by now an often-used technique to translate data as well as energy either over wires or through the air by the use of photons. Applications range from simple infrared remote control through optical energy supply to sensors through glass fibers to optical communications technology. Bidirectional data transmission and simultaneous energy transmission between a reader device and a data carrier have long been known and are technically feasible in principle. Nevertheless, that technology has so far not gained wide use.

SUMMARY OF THE INVENTION

It is accordingly an object of the invention to provide an optical switch, which overcomes the hereinafore-mentioned disadvantages of the heretofore-known devices of this general type and which is in the form of a monolithic component that enables wider use of such technology than before, especially in the field of optical contacting of an identification system or chip card.

With the foregoing and other objects in view there is provided, in accordance with the invention, an optical switch, comprising an optical transmission path having an optical transmission medium, an input-side end and an output-side end; a radiation source associated with the input-side end for emitting a primary optoelectronic signal being coupled into the transmission path; a reflection device associated with the output-side end for receiving the primary optoelectronic signal and converting the primary optoelectronic signal into a secondary, modulated optoelectronic signal being reflected and coupled back into the transmission path; and a receiver associated with the input-side end of the transmission path for responding to the secondary, modulated optoelectronic signal to perform an electronic switching operation.

In accordance with another feature of the invention, the switching operation is accomplished by using only a single fiber.

In accordance with a further feature of the invention, there is provided an optical separator device associated with the receiver disposed on the input-side end of the transmission path, the separator responding differently to the primary optoelectronic signal of the radiation source and the secondary, modulated optoelectronic signal of the reflection device.

In accordance with an added feature of the invention, the receiver is preceded by an optoelectronic filter, which is essentially transmissive only to the secondary, modulated optoelectronic signal.

In accordance with an additional feature of the invention, the receiver disposed on the input-side end of the transmission path is assigned a circuit which derives a control signal for performing the electronic switching operation, as a reaction to the secondary, modulated optoelectronic signal detected by the receiver.

In accordance with yet another feature of the invention, the secondary signal reflected back from the reflection device is pulse width modulated relative to the primary optoelectronic signal.

In accordance with yet a further feature of the invention, in a mechanically constructed configuration of the reflection device of the optical switch, the reflection device has at least one mechanically movable and in particular oscillatable mirror, and the modulation frequency of the secondary optoelectronic signal matches the oscillation frequency of the mirror. A single oscillatable mirror, for instance, is provided at the output of the transmission path and is excited in the switching operation. In accordance with still an added feature of the invention, the reflection of the light signal back into the (single) fiber is modulated periodically in accordance with the natural or resonant frequency or some frequency of the mirror imposed from outside. In this way, on the transmitter side, which, for instance, includes a light emitting diode and a phototransistor, it is possible through the use of suitable electrical circuits to separate the reflected light signal of the primary mirror (that is, the mirror in repose) from the reflected secondary light signal of the mirror in oscillation. The electrical alternating signal that is produced by the modulated portion of the reflected light signal in a phototransistor, for instance, can then be used to trip a switching operation.

Since the natural frequency of the mirror is adjustable in a manner known per se by way of geometry and its component material, embodiments can furthermore be attained that have a number of mirrors each with a different natural frequency and accordingly each generating different secondary, modulated light signals. They may be separated from one another, for instance, by suitable separating filters on the input side, or electronically through the use of suitable circuit provisions. Through the use of a switch device that is associated with the adjustment of the reflection device, for instance in the form of a knob-type switch in which each switching position is equipped with a mirror of different natural frequency, a certain selected mirror can be positioned into or out of the beam path of the optical transmission path.

In accordance with yet an added feature of the invention, the excitement of oscillation of the at least one mirror is effected mechanically or electrically or magnetically. For instance, it is also possible for a magnetically sensitive mirror to be moved into the beam path of the optical transmission medium by putting it into a periodic oscillation that is imposed by an external magnetic alternating field and thus differs from the natural frequency.

In accordance with still another feature of the invention, the reflection device has a number of mirrors with different resonant frequencies, and there is provided a switch device associated with adjustment of the reflection device for positioning a selected one of the mirrors at a time into and out of a beam path of the optical transmission path.

In accordance with yet an additional feature of the invention, in a further, optoelectronic version of the optical switch, the reflection device has, instead of a mirror, at least one photosemiconductor, preferably a photodiode including a direct semiconductor, such as one made of GaAs, InP, or other binary, ternary or quaternary direct semiconductors. Upon irradiation with light at a wavelength of less than or equal to the band gap wavelength, pairs of electrons and holes are produced in the interior of the semiconductor.

When the circuit is open, the charge carriers recombine, outputting a photon having a wavelength which is $\lambda = 1.24/E_g$ ($\mu$m), where $E_g$ designates an energy gap of the semiconductor. If the voltage source being used is, for instance, a semiconductor layer with an emission wavelength of 850 nm and a GaAs photodiode is used as the reflection device, then upon irradiation this photodiode emits a light signal with a peak wavelength of approximately 900 nm. These two wavelengths can be separated from one another by suitable filters on the input side of the optical transmission path, so that the primary laser light can be separated from the secondary photodiode light.

In accordance with again another feature of the invention, there is provided a switch device for moving the at least one photosemiconductor into and out of a beam path of the optical transmission path.

In accordance with a concomitant feature of the invention, the reflection device has a number of photosemiconductors with different emission wavelengths.

If the photodiode located on the output-side end of the optical transmission path is moved into the beam path of the primary light signal, then a light radiation having the wavelength of the photodiode is generated in this photodiode and is coupled into the fiberoptical waveguide, reflected at a separating mirror disposed on the input-side end of the transmission path, and detected by a receiver photodiode. If the photodiode is located on the output-side end of the transmission path outside the beam path of the primary light signal, then no signal is indicated by the receiver-side photodiode. By moving the output-side photodiode into or out of the beam path of the primary light signal, a switching operation can thus be tripped by the receiver-side photodiode.

The configuration according to the invention can be used in particular to monitor fiberoptical waveguides to determine whether or not there is a line break, so that a switching system associated with the configuration, for instance, will always be turned off automatically if no signal arrives from the receiver-side photodiode. Such a configuration can be advantageously used in limit switches in particular.

The laser diode or light-emitting diode being used, for example as a radiation source on the input-side end of the optical transmission path, can be operated in the continuous mode (c-w-mode) or in the pulse mode. In relatively slow switching operations, a pulsed mode (with long pauses between pulses, for instance) is advantageous, since this reduces the load on the transmitting components and accordingly lengthens their service life, and electronic circuits can be constructed to be less vulnerable to malfunction.

Other features which are considered as characteristic for the invention are set forth in the appended claims.

Although the invention is illustrated and described herein as embodied in an optical switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
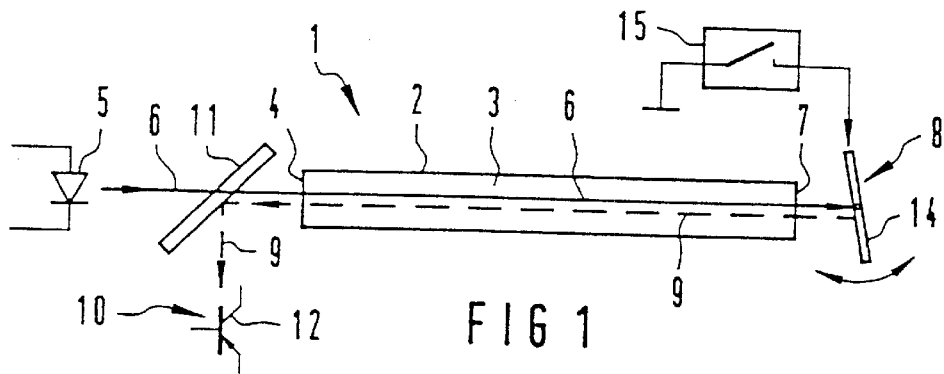
FIG. 1 is a diagrammatic, elevational view of an optical switch having only one fiber, in accordance with a first exemplary embodiment of the invention.
Figure 2:
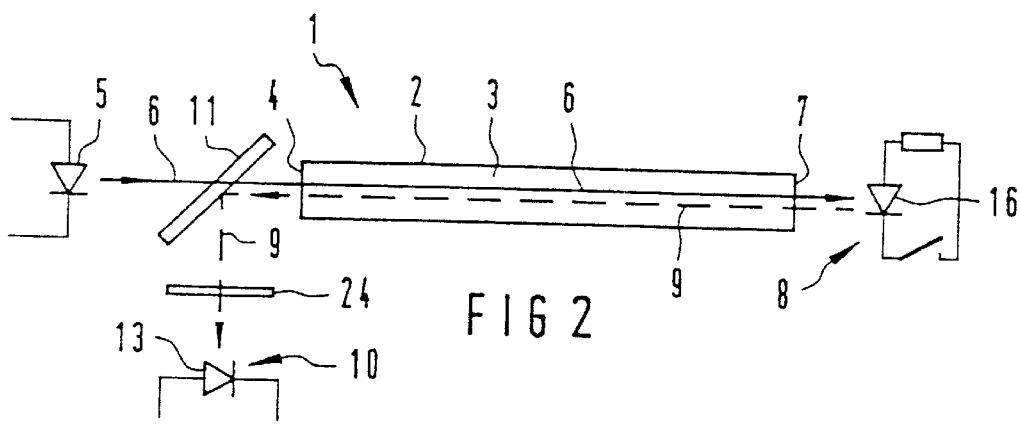
FIG. 2 a view similar to FIG. 1 of an optical switch having only one fiber, in accordance with a second exemplary embodiment of the invention.

Referring now to the figures of the drawings in detail and first, particularly, to FIGS. 1 and 2 thereof, there are seen exemplary embodiments of an optical switch 1 including an optical transmission path 2 having an optical transmission medium 3 with only a single fiber as a fiberoptical waveguide.

A radiation source 5, preferably a semiconductor laser or semiconductor photodiode, which emits a primary light signal 6, is associated with an input-side end 4 of the optical transmission path 2. The primary light signal 6 is coupled into the transmission path 2 and is delivered to a reflection device 8 disposed on an output-side end 7 of the transmission path 2. Through the use of the reflection device 8, the primary optoelectronic signal or optical signal 6 is converted into a secondary, modulated optoelectronic signal 9, which is coupled back into the optical transmission path 2 and transmitted to a receiver 10, through a separating mirror 11 that is located on the input-side end 4 of the transmission path 2 and is transmissive or permeable to the primary light signal 6. By way of example, the receiver 10 may have a phototransistor 12 as in the embodiment of FIG. 1 or a photodiode 13 as in the embodiment of FIG. 2. In either case, the receiver 10 responds to the secondary light signal 9 being received and releases a switching operation through the use of a non-illustrated electronic circuit, for instance in order to trigger other non-illustrated circuits.

In the first exemplary embodiment of FIG. 1, the reflection device 8 at the output of the transmission path 2 has an oscillatable mirror 14, which is excited in the switching operation in such a way that the back-reflection of the light signal into the fiber is periodically modulated in accordance with either the natural frequency of the mirror 14 or a frequency imposed on the mirror 14 from outside. In this way, on the emitter side, through the use of suitable non-illustrated electric circuits, the reflected light of the primary mirror (that is, the mirror in repose) can be separated from the reflected light of the oscillating mirror 14. The electrical alternating signal that is produced by the modulated portion of the reflected light in the phototransistor 12 can then be used to trip a switching operation. The natural frequency of the mirror 14 can be adjustable through its geometry and material. Rotary switches, for instance, in which each switch position is equipped with a mirror of a different natural frequency, are also achievable. A switch device 15 may be associated with adjustment of the reflection device 8 for positioning a selected one of the mirrors at a time into and out of a beam path of the optical transmission path 2.

Exciting the oscillation of the mirror 14 can be effected mechanically or electrically or magnetically. For instance, it is possible for a magnetically sensitive mirror to be put into a periodic oscillation imposed by an external magnetic alternating field, or in other words an oscillation that differs from its natural frequency.

FIG. 2 shows a second exemplary embodiment of the invention, in which a photodiode 16 including a direct semiconductor, such as GaAs or InP, or other binary, ternary or quaternary direct semiconductors is provided, instead of a mirror.

Figure 3A:
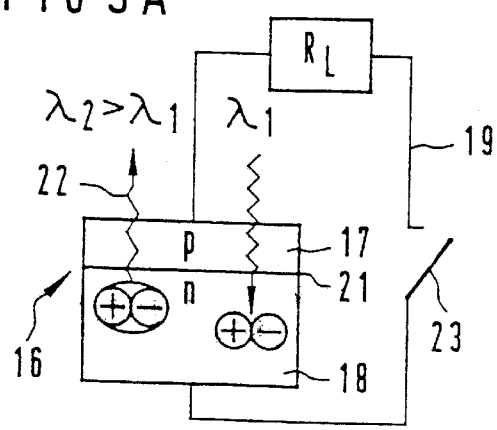
FIGS. 3A and 3B are schematic circuit diagrams of a semiconductor photodiode with the switch being respectively open and closed for an explanation of the fundamental physical principle involved.
Figure 3B:
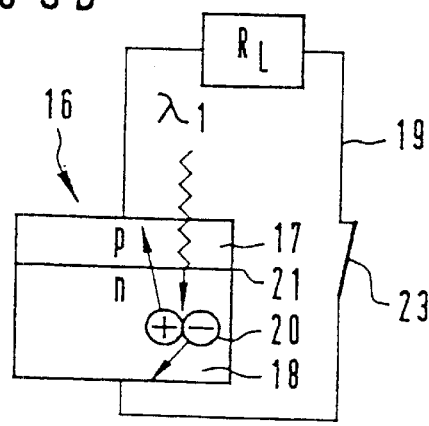

The mode of operation of the photodiode 16 will be described in conjunction with the schematic illustration of FIG. 3A and FIG. 3B.

When the photodiode 16 is irradiated with light, electron hole pairs are generated in the semiconductor interior. If an anode 17 and a cathode 18 of the diode 16 of FIG. 3B are short-circuited through an external circuit 19, then the electron hole pairs 20 are separated by an internal field at a pn junction 21, and a current Ip flows through the external circuit. In the open circuit of FIG. 3A, the electron hole pairs generated by the photons reunite. The energy given off as a result is output to the gate in the case of an indirect semiconductor (such as Si). The semiconductor finally warms up. In the case of a direct semiconductor, such as GaAs, when an electron hole pair recombines, the energy is given off in the form of a photon 22. Opening and closing a switch 23 in the external circuit 19 enables the diode 16 to transmit an optical alternating signal corresponding to the switching frequency while being irradiated constantly. The energy for the emitted photons 22 is derived solely from the absorbed photons of the primary light signal 6. This involves what is known as an O/O converter (O stands for optical). GaAs, corresponding to the band gap, has an emission peak at approximately 900 nm. In other words, only light equal to or less than 900 nm can generate electron hole pairs. If a light source 5 that is markedly below 900 nm (for instance, being at 800 nm) is chosen, then the two wavelengths can be optically separated without difficulty, for instance through the use of a suitable filter 24 that precedes the receiver 10 and blocks light having a wavelength below a limit value.

I claim:

1. An optical switch, comprising:
   an optical transmission path having an optical transmission medium, an input-side end and an output-side end;
   a radiation source associated with said input-side end for emitting a primary optical signal being coupled into said transmission path;
   a reflection device associated with said output-side end for receiving the primary optical signal and converting the primary optical signal into a secondary, modulated optical signal being reflected and coupled back into said transmission path; and
   a switching device associated with said input-side end of said transmission path for receiving and responding to the secondary, modulated optical signal to perform an electronic switching operation.

2. The optical switch according to claim 1, wherein said optical transmission medium of said optical transmission path is a fiberoptical waveguide having a single fiber.

3. The optical switch according to claim 1, including an optical separator device associated with said switching device for responding differently to the primary optical signal of said radiation source and the secondary, modulated optical signal of said reflection device.

4. The optical switch according to claim 3, wherein said optical separator has an optoelectronic filter being essentially transmissive only for the secondary, modulated optical signal.

5. The optical switch according to claim 1, including a circuit associated with said switching device for deriving a control signal for performing an electronic switching operation as a reaction to the secondary, modulated optical signal detected by said switching device.

6. The optical switch according to claim 1, wherein the secondary signal reflected back from the reflection device is pulse width modulated relative to the primary optical signal.

7. The optical switch according to claim 1, wherein said reflection device has at least one oscillatable mirror with an oscillation frequency, and the secondary optical signal has a modulation frequency matching the oscillation frequency of said mirror.

8. The optical switch according to claim 1, wherein said reflection device has at least one mechanically movable mirror.

9. The optical switch according to claim 7, wherein the oscillation frequency of said mirror is essentially a resonant frequency of said mirror.

10. The optical switch according to claim 7, wherein the oscillation frequency of said mirror is a frequency imposed from outside that deviates from a resonant frequency of said mirror.

11. The optical switch according to claim 7, including a drive or control for inciting oscillation of said mirror mechanically, electrically or magnetically.

12. The optical switch according to claim 8, including a drive or control for inciting motion of said mirror mechanically, electrically or magnetically.

13. The optical switch according to claim 1, wherein said reflection device has a number of mirrors with different resonant frequencies, and including a switch device associated with adjustment of said reflection device for positioning a selected one of said mirrors at a time into and out of a beam path of said optical transmission path.

14. The optical switch according to claim 1, wherein said reflection device has at least one photosemiconductor for emitting the secondary, modulated optical signal after irradiation with the primary optical signal, by generation and recombination of pairs of electrons and holes.

15. The optical switch according to claim 14, wherein the secondary, modulated optical signal has a different emission wavelength than the primary optical signal.

16. The optical switch according to claim 14, including a second switch device for moving said at least one photosemiconductor into and out of a beam path of said optical transmission path.

17. The optical switch according to claim 1, wherein said reflection device has a number of photosemiconductors with different emission wavelengths.

18. The optical switch according to claim 1, wherein said switching device is a phototransistor.

19. The optical switch according to claim 1, wherein said switching device is a photodiode.

* * * * *